United States Patent [19]

Todokoro

[11] Patent Number: 4,827,127
[45] Date of Patent: May 2, 1989

[54] APPARATUS USING CHARGED PARTICLE BEAM

[75] Inventor: Hideo Todokoro, Nishitama, Japan

[73] Assignee: Hitachi, Ltd., Tokyo, Japan

[21] Appl. No.: 922,715

[22] Filed: Oct. 24, 1986

[30] Foreign Application Priority Data

Oct. 25, 1985 [JP] Japan ................. 60-237499

[51] Int. Cl.$^4$ ............................. H01J 37/26
[52] U.S. Cl. .................... 250/310; 250/398; 250/396 ML
[58] Field of Search ......... 250/396 ML, 396 R, 310, 250/398, 400, 442.1, 306, 307; 313/361.1

[56] References Cited

U.S. PATENT DOCUMENTS

| 3,733,484 | 5/1973 | Bayard ................. | 250/310 |
| 4,168,434 | 9/1979 | Lischke et al. ......... | 250/396 R |
| 4,376,249 | 3/1983 | Pfeiffer et al. ......... | 250/396 ML |
| 4,431,915 | 2/1984 | Nakagawa et al. ..... | 250/396 ML |
| 4,464,571 | 8/1984 | Plies ..................... | 250/305 |
| 4,588,891 | 5/1986 | Saito ..................... | 250/310 |

FOREIGN PATENT DOCUMENTS 571012  2/1959  Canada ................. 250/307

OTHER PUBLICATIONS

"Design of Electron Beam Scanning Systems Using the Moving Objective Lens", J. Vac. Sci. Technol., 15(3) May/Jun., 1978; Ohiwa, pp. 849–852.
Ohiwa et al., "Elimination of Third-Order Aberrations in Electron-Beam Scanning Systems", Electronics and Comm., vol. 54-B (12), 1971, pp. 44–57.
Goto et al., "MOL (Moving Objective Lens) Formulation of Deflection Aberration Free System", Optik, 48(1977), No. 3, 255–270.

*Primary Examiner*—Carolyn E. Fields
*Assistant Examiner*—John A. Miller
*Attorney, Agent, or Firm*—Antonelli, Terry & Wands

[57] ABSTRACT

An apparatus using a charged particle beam is disclosed which includes means for generating charged particles, means for accelerating the charged particles so that the charged particles have desired kinetic energy, lens means including at least one objective lens for focusing a charged particle beam formed of the accelerated, charged particles, on the surface of a specimen, scanning means for scanning the surface of the specimen two-dimensionally with the focused beam, detection means for detecting secondary electrons, reflected electrons, X-rays and light, all of which emerge from the surface of the specimen, objective lens moving means for moving an objective lens nearest to the specimen, and deflection means linked with the objective lens moving means for deflecting the charged particle beam so that the charged particle beam carries out parallel displacement at the objective lens by an amount corresponding to the moving distance of the objective lens.

14 Claims, 7 Drawing Sheets

APPARATUS USING CHARGED PARTICLE BEAM

BACKGROUND OF THE INVENTION

The present invention relates to an apparatus for scanning the surface of a specimen such as a semiconductor device two-dimensionally with a focussed, charged beam, and more particularly to an apparatus which can deflect a focussed, charged beam in a wide angular range to scan a large surface area of a specimen with the focussed, charged beam. Although only a scanning electron microscope according to the present invention will be explained later, by way of example, the present invention is not limited to the scanning electron microscope but is applicable to an apparatus, in which a charged particle beam is deflected to scan a specimen surface therewith.

In a conventional scanning electron microscope, as described on page 17 of a Japanese text book entitled "SOSAKENBIKYO NO KISO TO OYO (Elementary Knowledge and Applications of Scanning Electron Microscope)" published by KYORITSU SYUPPAN Co., Ltd. on Dec. 1, 1983, an electron beam is arranged so as to pass through the center of an objective lens, and a specimen irradiated with the electron beam is moved horizontally so that the electron beam impinges upon a desired surface portion of the specimen, in spite of the fact that the electron beam can be deflected by an electric or magnetic field so as to cover the desired surface portion of the specimen. This is because, in order for the scanning electron microscope to realize a spatial resolution of about 100Å, the electron beam is required to pass through the center of the objective lens, to minimize the aberration with respect to the objective lens.

FIG. 11 is a schematic diagram showing the deflection of electron beam in the conventional scanning electron microscope. Referring to FIG. 11, in order to prevent the spherical aberration of an objective lens 3, an electron beam 5 is deflected by deflectors 1 and 2 so that the beam 5 always passes through the center of the lens 3. When the deflection angle at the center of the lens 3 is expressed by $\beta$, the diameter $\Delta d$ of disk of confusion is given by the following approximate equation:

$$\Delta d \approx 0.014 \times \beta \times L \times \frac{\Delta V}{V} \times \frac{IN}{\sqrt{V}}$$

where V indicates an accelerating voltage, $\Delta V$ the energy spread of the electron beam, IN the ampere-turn of the objective lens, and L the distance between the objective lens and a specimen 4. For example, in a case where the accelerating voltage V is 10KV, the energy spread $\Delta V$ is 1V, a ratio $IN/\sqrt{V}$ is 15, the distance L is 50 mm, and the deflection angle $\beta$ is 0.1 radian, the moving distance of the electron beam at the surface of the specimen will be 5 mm, and the diameter of disk of confusion will be 1$\mu$. Thus, the deflection angle $\beta$ has been made less than $10^{-3}$ radian, to make $\Delta d$ smaller than 100Å. Accordingly, in order to observe a large surface area of the specimen 4, it is necessary to move the specimen horizontally.

In recent years, a scanning electron microscope has been used as an electron beam tester for observing the internal operation of an integrated circuit. In an electron beam tester, a completed large scale integration circuit is used as a specimen, and the operating state thereof is observed. Accordingly, there arise problems that a large number of lead wires connected to a specimen have to be introduced in a vacuum chamber and the specimen has to be horizontally moved within the vacuum chamber. In short, the electron beam tester has a drawback that such a specimen has to be horizontally moved in vacuum.

SUMMARY OF THE INVENTION

An object of the present invention is to provide a charged particle beam utilizing apparatus which can solve the above problems of the prior art, and in which a charged particle beam is deflected in a wide angular range in such a manner that the movement of an objective lens is linked with the deflection of the charged particle beam, to irradiate a large surface area of a specimen with the charged particle beam, without moving the specimen.

In order to attain the above object, according to the present invention, there is provided an apparatus using a charged particle beam, which apparatus comprises means for generating charged particles, means for accelerating the charged particles so that the charged particles have desired kinetic energy, lens means including at least one objective lens for focussing a charged particle beam formed of the accelerated, charged particles, on the surface of a specimen, scanning means for scanning the surface of the specimen two-dimensionally with the focused beam, detection means for detecting secondary electrons, reflected electrons, X-rays and light, all of which emerge from the surface of the specimen, objective lens moving means for moving an objective lens nearest to the specimen, and deflection means linked with the objective lens moving means for deflecting the charged particle beam so that the charged particle beam carries out parallel displacement at the objective lens by an amount corresponding to the moving distance of the objective lens.

That is, in the above apparatus according to the present invention, the objective lens is moved in a horizontal direction parallel to the surface of the specimen, and the objective lens moving means is linked with the deflection means to cause the charged particle beam (for example, an electron beam) to carry out parallel displacement so that the electron beam always passes through the center of the objective lens.

DESCRIPTION OF THE PREFERRED EMBODIMENTS

The present invention will be explained below in detail, on the basis of depicted embodiments thereof.

Figure 1:
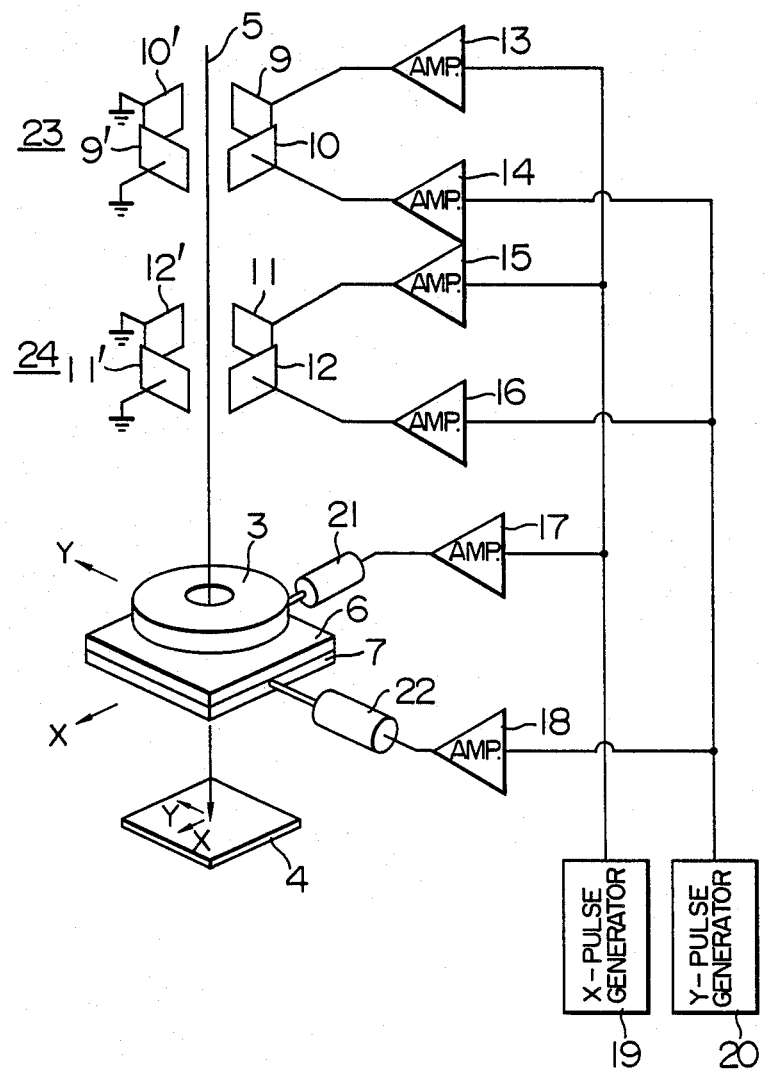
FIG. 1 is a schematic view showing a main part of a charged particle beam utilizing apparatus according to the present invention.

FIG. 1 schematically shows a scanning electron microscope (that is, an example of a charged particle beam utilizing apparatus) according to the present invention, in which the movement of an objective lens 3 is linked with the displacement of an electron beam 5 due to the deflection thereof. It is to be noted that scanning means for swinging the electron beam to obtain a scanned image of specimen surface is omitted from FIG. 1 for brevity's sake. Referring to FIG. 1, the objective lens 3 is mounted on an X-stage 6 and a Y-stage 7, and can be freely moved in horizontal directions by an X-pulse motor 21 and a Y-pulse motor 22. Further, the electron beam 5 is deflected by upper deflection means 23 and lower deflection means 24. In order to move the position of the electron beam 5 at the surface of the specimen 4 in an X-direction, it is necessary to move the objective lens 3. That is, a desired number of pulses are generated by an X-pulse generator 19, the pulses are amplified by an X-driving amplifier 17, and the X-pulse motor 21 is driven by the amplified pulses, to move the X-stage 6 in the X-direction in accordance with the number of rotations of the pulse motor 21. A linear relation depending upon the design of the X-stage 6 exists between the number of pulses and the moving distance of the X-stage 6. An X-deflection plate 9 of the upper deflection means 23 is connected to an X-deflection amplifier 13 which delivers an output voltage proportional to the number of pulses supplied from the X-pulse generator 19. Further, an X-deflection plate 11 of the lower deflection means 24 is connected to another X-deflection amplier 15 which delivers an output voltage proportional to the number of pulses supplied from the X-pulse generator 19. It is to be noted that the X-deflection amplifier 13 delivers the output voltage for deflecting the electron beam 5 in the X-direction, and the X-deflection amplifier 15 delivers the output voltage for deflecting the electron beam 5 in a direction opposite to the X-direction. The deflection angle of the electron beam caused by the X-deflection plate 9 is equal in absolute value to the deflection angle of the electron beam caused by the X-deflection plate 11. Accordingly, a position where the electron beam intersects with a horizontal plane lying under the lower deflection means 24, is spaced apart in the X-direction from a position where the non-deflected electron beam intersects with the horizontal plane, that is, the electron beam 5 carries out parallel displacement in the X-direction, in accordance with the number of pulses supplied from the X-pulse generator 19. The deflection of the electron beam 5 made by each of the upper and lower deflection means 23 and 24 is adjusted so that the amount of the above parallel displacement is equal to the moving distance of the X-stage 6 in the X-direction, and hence the electron beam 5 can always follow the movement of the objective lens 3 in the X-direction. Similarly to the parallel displacement of the electron beam 5 in the X-direction, the electron beam 5 can carry out parallel displacement corresponding to the movement of the objective lens 3 in the Y-direction, with the aid of a Y-pulse generator 20, a Y-driving amplifier 18, Y-deflection plates 10 and 12, Y-deflection amplifiers 14 and 16, and others. With the above structure, a position where the specimen 4 is irradiated with the electron beam, can be freely moved on the specimen surface while maintaining the incident direction of electron beam parallel to a Z-direction, by operating the X- and Y-pulse generators 19 and 20.

Although electrostatic deflection means 23 and 24 are shown in FIG. 1, the electron beam 5 may be deflected by electromagnetic deflection means. Further, deflection plates 9', 10', 11' and 12' which are grounded in FIG. 1, may be used for causing the electron beam 5 to perform a scanning operation. In this case, the deflection of the electron beam 5 due to the deflection plate 9' is made opposite in direction to the deflection due to the deflection plate 11', and the deflection due to the deflection plate 10' is made opposite in direction to the deflection due to the deflection plate 12'. Further, the deflection angle based upon the deflection plate 11' is made greater than the deflection angle based upon the deflection angle 9' and the deflection angle based upon the deflection plate 12' is made greater than the deflection angle based upon the deflection plate 10', in order for the electron beam 5 to swing as if the electron beam were pivoted at the center of the objective lens 3.

Figure 2:
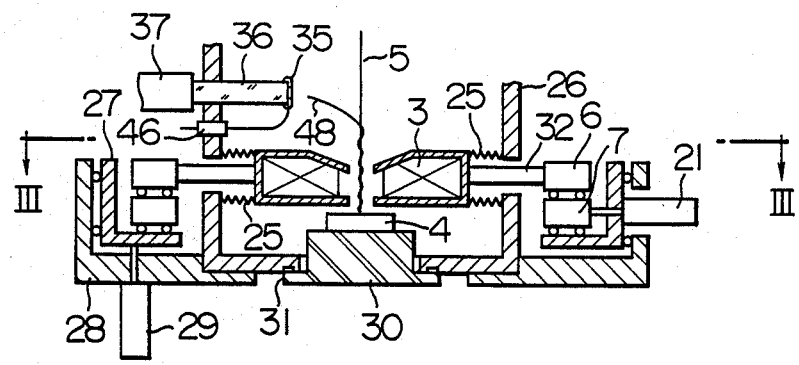
FIG. 2 is a sectional view showing a main part of an embodiment of a charged particle beam utilizing apparatus according to the present invention.
Figure 3:
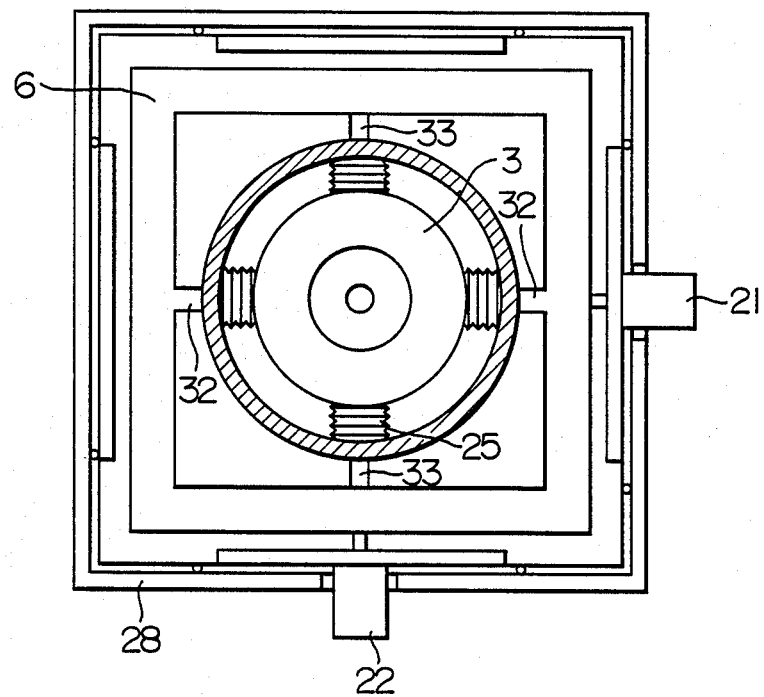
FIG. 3 is a sectional view taken along the line III—III of FIG. 2.

FIG. 2 is a sectional view showing a main part of an embodiment of a charged particle beam utilizing apparatus according to the present invention, and FIG. 3 is a sectional view taken along the line III—III of FIG. 2. In FIG. 3, a hatched area indicates the cross section of a cylindrical vacuum vessel. In the present embodiment, the objective lens 3 can be moved not only in a horizontal direction but also in a vertical direction. It is needless to say that the parallel displacement of the electron beam 5 is linked with the horizontal movement of the objective lens 3. The specimen 4 is fixed to a specimen holder 30, which is attached to an open end portion of a cylindrical vacuum vessel 26 through vacuum packing 31. If the objective lens 3 conducts only a horizontal movement, it will be necessary to adjust the height of the specimen 4 within a range from 0 to 1 mm. In some cases, however, it is difficult to adjust the height of the specimen 4. In view of the above, the present embodiment is provided with a Z-stage 27, in addition to the X-stage 6 and the Y-stage 7. The Z-stage 27 is moved vertically along the side wall of a base 28, through the aid of a Z-pulse motor 29. In the present embodiment, the objective lens 3 is connected to the vacuum vessel 26 by four bellows 25 which are extended from the objective lens 3 in radial directions, and movable shafts for moving the objective lens are inserted into the bellows 25 to be attached to the objective lens 3. Thus, the objective lens 3 can be moved in vacuum. Secondary electrons emitted from that portion of the specimen surface which is irradiated with the electron beam 5, pass through the magnetic field of the objective lens 3, and are then detected by a secondary electron detector, which is made up of a scintillator 35 disposed over the objective lens 3, a light guide 36, and a photo-multiplier 37. The scintillator 35 is applied with a high voltage (for example, 10KV) through a feed through 46, to attract secondary electrons 48. The output signal of the secondary electron detector is used for forming an image of the specimen surface. The method of forming the above image is well known, and hence explanation thereof will be omitted. In the present embodiment, the secondary electron detector is disposed above the objective lens 3. However, the secondary electron detector is not limited to such a place, but may be disposed between the objective lens 3 and the specimen 4. Incidentally, as shown in FIG. 3, a movable shaft 32 is fixed to the X-stage 6 and driven by the X-pulse motor 21. While, a movable shaft 33 is fixed to the Y-stage 7 of FIG. 2 and driven by the Y-pulse motor 22.

Figure 4:
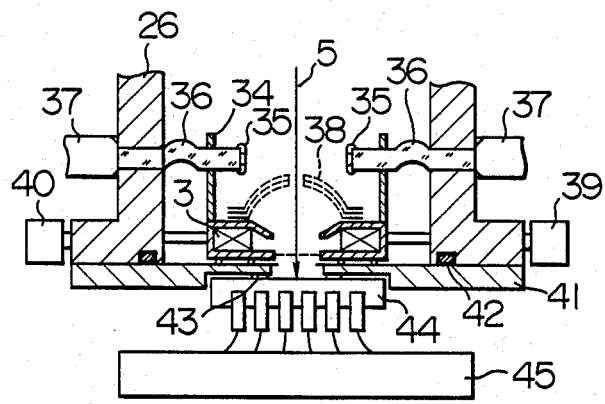
FIGS. 4 and 5 are sectional views showing main parts of another and a further embodiments of a charged particle beam utilizing apparatus according to the present invention.

FIG. 4 is a sectional view showing a main part of another embodiment of a charged particle beam utilizing apparatus according to the present invention. In the present embodiment, the secondary electron detector is moved together with the objective lens 3, to prevent a change in secondary electron detection efficiency caused by the movement of the objective lens 3. Referring to FIG. 4, the objective lens 3 can slide on a base plate 41 which abuts against the open end portion of the cylindrical vacuum vessel 26 through vacuum packing 42. The movement of the objective lens 3 is adjusted by rotating controls 39 and 40. Each of the controls 39 and 40 is inserted into the inside of the vacuum vessel 46 through an O-ring seal or ferro-fluid seal. One end of the light guide 36 formed of an optical fiber is fixed to the objective lens 3 through a fixing plate 34. The scintillator 35 is mounted on one end surface of the light guide 36, and is applied with a voltage to attract and accelerate secondary electrons, though voltage applying means is not shown in FIG. 4. The other end of the light guide 36 is fixed to the cylindrical vacuum vessel 26. A photo-signal having passed through the light guide 36 is detected by the photo-multiplier 37, the output of which is used as a video signal. An energy analyzer (or an energy filter) 38 for secondary electrons is disposed over the objective lens 3. The electric potential of that position of the specimen surface which is irradiated with the electron beam 5, can be measured by using the energy analyzer 38. That is, the potential distribution on an LSI (namely, a large scale integration circuit) can be measured by using such an energy analyzer. In the present embodiment, the package 44 of an LSI is attached to the base plate 41 through a packing rubber 43, and the LSI is operated by a driving source 45.

As mentioned above, the present embodiment is provided with the energy analyzer 38 for secondary electrons. In a case where it is unnecessary to measure the potential of the specimen, however, the energy analyzer 38 can be omitted.

Figure 5:
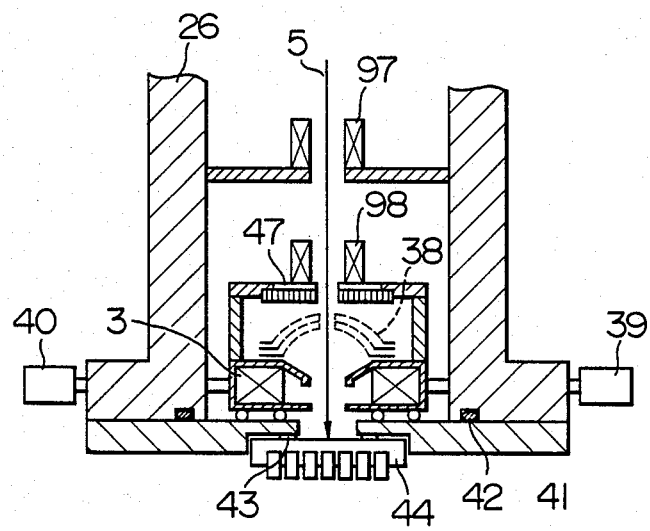
Figure 11:
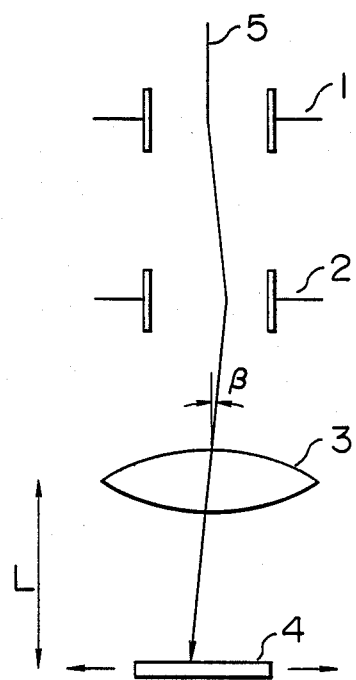
FIG. 11 is a schematic diagram showing the deflection of electron beam in a conventional scanning electron microscope.

FIG. 5 is a sectional view showing a main part of a further embodiment of a charged particle beam utilizing apparatus according to the present invention. In the present embodiment, the objective lens 3 and a lower deflection coil 98 (corresponding to the second deflector 2 of FIG. 11) are moved as one body. While, an upper deflection coil 97 (corresponding to the first deflector 1 of FIG. 11) is fixed to the cylindrical vacuum vessel 26. According to the above structure, even when the electron beam 5 is deflected in a large degree by the upper deflection coil 97, the electron beam 5 can pass through the center of the lower deflection coil 98, and thus an optimum condition is maintained. Further, the present embodiment is provided with a detector 47 having the form of a flat plate for detecting secondary electrons, for example, a channel plate or a semiconductor detector. Such a detector can be connected to a fixed portion only by flexible lead wires, and hence it is easy to move the objective lens 3.

Figure 6:
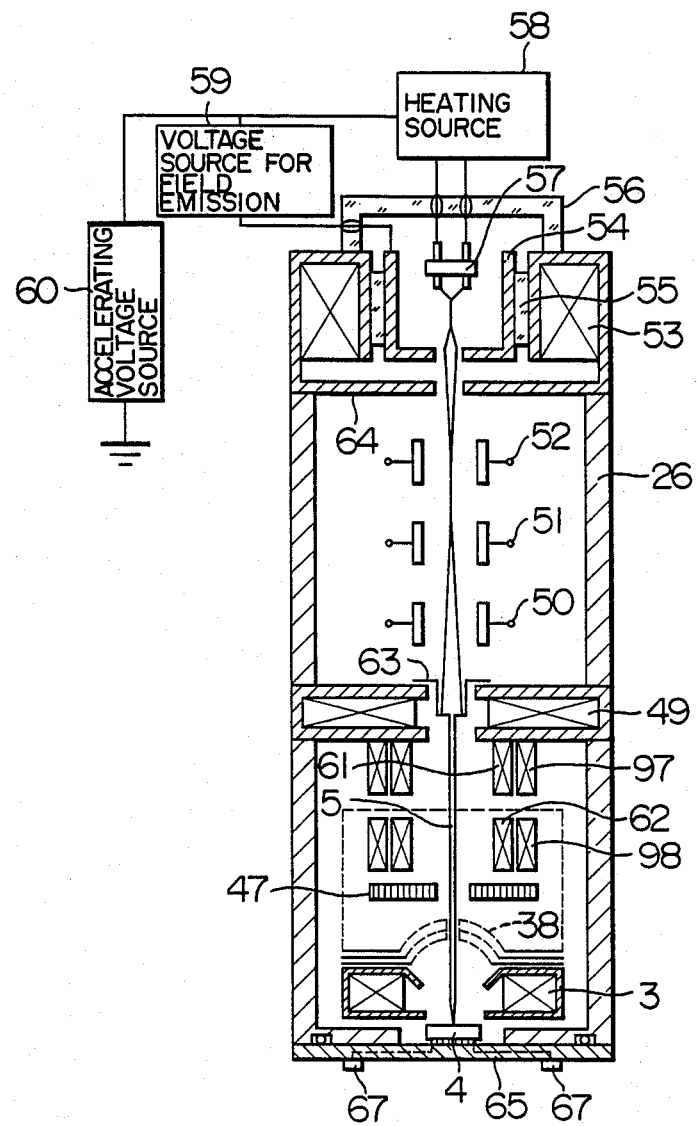
FIG. 6 is a view, partly in section and partly in block, of a different embodiment of a charged particle beam utilizing apparatus according to the present invention.

FIG. 6 is a view, partly in section and partly in block, of a different embodiment of a charged particle beam utilizing apparatus according to the present invention. In the present embodiment, the lower deflection coil 98, the channel plate 47 for detecting secondary electrons, the energy analyzer 38, and the objective lens 3 are all moved, as one body. A mechanism for moving these members is omitted from FIG. 6, for the sake of simplicity. As shown in FIG. 6, an upper scanning coil 61 and the upper deflection coil 97 are arranged at the same place, and a lower scanning coil 62 and the lower deflection coil 98 are arranged at the same place. It is a matter of course that the operations of the upper and lower deflection coils 97 and 98 are linked with the movement of the objective lens 3. The electron beam 5 is focused on the specimen 4 by the objective lens 3, and the scanning coils 61 and 62 causes the electron beam 5 to perform a scanning operation for the specimen 4, to obtain an image of the scanned area of the specimen surface. As has been explained with respect to the apparatus of FIG. 1, in a scanning operation, the electron beam 5 swings as if the electron beam were pivoted at the center of the objective lens 3. An auxiliary objective lens 49 is disposed on the upper deflection coil 97. The auxiliary objective lens 49 and the objective lens 3 are usually operated in tandem so as to form parallel cathode rays between the lenses 49 and 3. For example, in a case where the objective lens 3 is put in an OFF-state and the electron beam 5 is focused on the specimen 4 only by the auxiliary objective lens 49, the present embodiment acts as a microscope of tens of magnifications. In this case, for example, the upper scanning coil 61 is put in an OFF-state, and only the lower scanning coil 62 is used for causing the electron beam 5 to perform a scanning operation. Energy selection is made for secondary electrons emitted from the specimen 4, by the energy analyzer 38, and the selected secondary electrons are detected by the channel plate 47. The present embodiment can be formed by applying the present invention to a stroboscopic scanning electron microscope (that is, an electron beam tester) for obtaining a stroboscopic image of the specimen surface or measuring the potential distribution on the specimen surface. (Refer to IEEE Journal of solid state circuits, Vol. SC-13, No. 3, 1978.) The present embodiment is further provided with deflection plates 51 and 50, to make the electron beam 5 pulsive. The deflection plate 51 is applied with a high frequency voltage which oscillates between +2.5 V and −2.5 V, to cause the electron beam 5 to go and return on an aperture plate 63 having a small opening. Only when the electron beam 5 moves on the opening, the electron beam passes through the aperture plate 63. The deflection plate 50 is applied with another high frequency voltage which oscillates between 0V and 5V and is 90° out of phase with the high frequency voltage applied to the deflection plate 51. Thus, only one pulsive electron beam is sent out from the aperture plate 63 in one period of the high frequency voltage. A deflector 52 is used for the alignment of the electron beam 5, and is composed of an X-deflector and a Y-deflector. A field emitter 57 serving as an electron source is formed of, for example, a tungsten wire tapered to a sharp point, or in made by diffusing titanium or zirconium into the tungsten wire. The field emitter 57 is connected to a heating source 58 through an insulator 56, to be subjected to flashing or heated continuously. A first anode 54 confronts the field emitter 57, and is connected to a voltage source 59 for field emission also through the insulator 56, to form a strong field in the vicinity of the sharp point of the field emitter 57, thereby emitting electrons from the sharp point. The emitted electrons are accelerated by an accelerating voltage which is supplied from an accelerating voltage source 60 and is applied between the field emitter 57 and a second anode 64. The first anode 54 and the second anode 64 act as pole pieces of an electromagnetic lens 53 which is used as a condenser lens. Since the first anode 54 is applied with a high voltage for field emission, an insulator 65 is interposed between the first anode 54 and the condenser lens 53. The electron beam 5 emitted from the field emitter 57 is focused on the center of a deflector composed of the deflection plate 51 and a deflection plate opposite thereto, by the condenser lens 53. The specimen 4 is mounted on a specimen holding plate 65, and a desired voltage can be applied to the specimen 4 through terminals 67 provided on the outside of a vacuum chamber.

Figure 7:
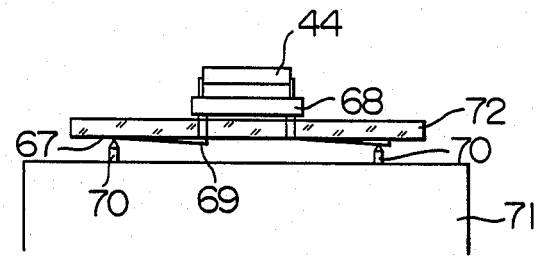
FIG. 7 is a sectional view showing an example of the specimen holding plate 65 of FIG. 6.

FIG. 7 shows an example of the specimen holding plate 65 of FIG. 6. Referring to FIG. 7, a socket 68 is mounted on an insulating substrate 72, and is connected to the terminals 67 by lead wires 69. The lead wires 69 pass through the through holes of the substrate 72, and the through holes are filled with an adhesive, to be hermetically sealed. The package 44 of an LSI which is a specimen, is inserted in the socket 68. The terminals 67 are connected to, for example, the test head of an IC tester disposed outside of a vacuum chamber, through pins 70.

Figure 8:
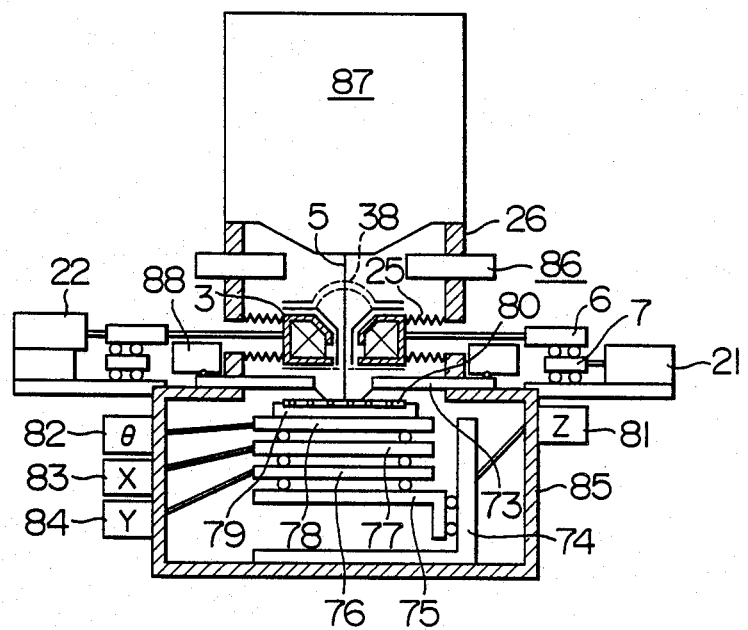
FIG. 8 is a sectional view showing a main part of an additional embodiment of a charged particle beam utilizing apparatus according to the present invention.

FIG. 8 shows an additional embodiment of a charged particle beam utilizing apparatus according to the present invention. The present embodiment is used for testing IC's formed on a semiconductor wafer. Referring to FIG. 8, an electron beam generating part 87 lying over the objective lens 3 has the same structure as in the embodiment of FIG. 6. Further, a mechanism for moving the objective lens 3 is similar to that shown in FIG. 2. While, a feature of the present embodiment resides in that a prober-card 73 for applying a voltage to a wafer 80 is interposed between the cylindrical vacuum vessel 26 and a specimen chamber 85. The voltage applied to the wafer 80 is supplied from an IC driver 88 which is provided on the outside of the vacuum vessel 26. Another feature of the present embodiment resides in the following structure. That is, the wafer 80 is fixed to a wafer holding base 79, which is attached to a stage 78. The stage 78 is slidably mounted on an X-stage 77, which is slidably mounted on a Y-stage 76. The Y-stage 76 is slidably mounted on a Z-stage 75, which can slide vertically on the vertical wall of a fixed stage 74. Since the above members are contained in the specimen chamber, an operator can move a desired IC on the wafer 80 to a position irradiated with the electron beam 5, by rotating one or some of controls 81 to 84 provided on the outside of the specimen chamber 85, while observing a scanned image. It is needly to say that the above movement of the wafer 80 can be made while maintaining the specimen chamber 85 at a vacuum condition.

Figure 9:
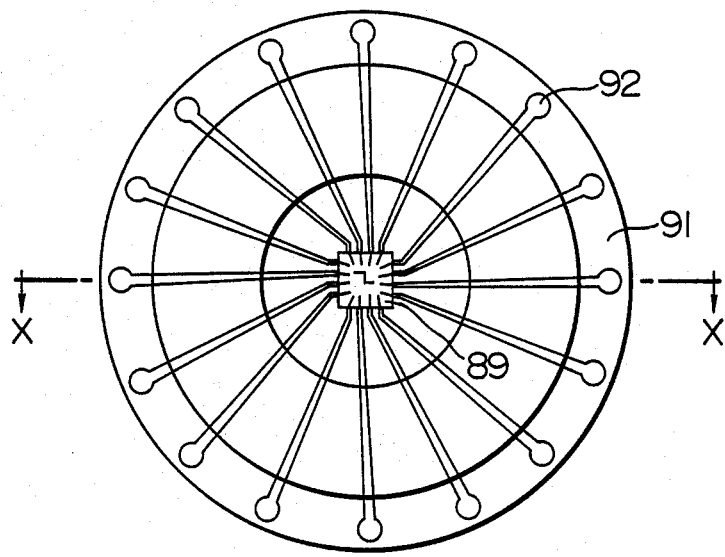
FIG. 9 is a plan view showing an example of the prober-card 73 of FIG. 8.
Figure 10:
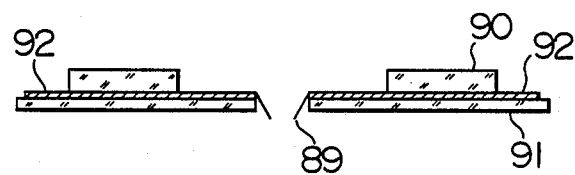
FIG. 10 is a sectional view taken along the line X—X of FIG. 9.

FIG. 9 is a plan view showing an example of a prober-card 73 of FIG. 8, and FIG. 10 is a sectional view taken along the line X—X of FIG. 9. Referring to FIGS. 9 and 10, lead wires 92 are provided on a substrate 91 which is made of a resin, through printed circuit techniques, and one end of each lead wire is attached to a prober 89. Further, a resin 90 such as epoxy resin is provided on the substrate 91 in the form of a doughnut, to be used as a vacuum seal for separating a region surrounded by the resin 90, from the outside.

As has been explained by reference to FIGS. 1 to 7, in a charged particle beam utilizing apparatus according to the present invention, it is unnecessary to move a specimen. Accordingly, the above apparatus is suitable for observing a specimen provided with a large number of lead wires such as an IC element, and is simpler in structure of specimen holding means and specimen chamber than a conventional apparatus. Further, according to the present invention, there is provided an apparatus for observing an IC wafer, in which apparatus a desired IC on the wafer can be moved to an electron beam irradiated position, by operating controls provided on the outside of an evacuated specimen chamber. Thus, the present invention makes possible various operations which cannot be performed by a conventional apparatus, and hence can exhibit remarkable effects in the fields of research and industry.

I claim:

1. An apparatus using a charged particle beam, comprising:
   means for generating charged particles;
   means for accelerating said charged particles so that said charged particles have desired kinetic energy;
   lens means including at least one objective lens for focusing a charged particle beam formed of the accelerated, charged particles, on a surface of a specimen;
   scanning means for scanning the surface of said specimen two-dimensionally with the focused charged particle beam;
   detection means for detecting at least one of secondary electrons, reflected electrons, X-rays and light, all of which emerge from the surface of said specimen;
   objective lens moving means for mechanically moving an objective lens nearest to said specimen in a horizontal plane parallel to the surface of said specimen; and
   deflection means responsive to said objective lens moving means for laterally moving an axis of said charged particle beam in parallel to an initial charged particle beam axis by an amount corresponding to the mechanical movement of said objective lens so that said charged particle beam is substantially perpendicular to said objective lens and always passes through the center of said objective lens to be incident on different portions of the surface of said specimen without moving said specimen.

2. An apparatus according to claim 1, wherein said objective lens moving means further includes means for moving said objective lens in a direction perpendicular to said horizontal plane.

3. An apparatus according to claim 1, said deflection means is disposed over said objective lens and is made up of upper deflection means and lower deflection means, and wherein each of said upper deflection means and said lower deflection means deflects said charged particle beam by an amount corresponding to the movement of said objective lens.

4. An apparatus according to claim 1, wherein said scanning means is made up of upper scanning means and lower scanning means, each of which is formed of one of electrostatic scanning means and electromagnetic scanning means, and means for supplying a scanning voltage or current to each of said upper scanning means and said lower scanning means which is superposed on a deflection voltage or current which is supplied to said deflection means and corresponds to the movement of said objective lens, wherein the axis of said charged particle beam carries out parallel displacement at said objective lens by an amount corresponding to the movement of said objective lens, and then swings as if said particle beam were pivoted at the center of said objective lens, on the axis of said scanning voltage or current.

5. An apparatus according to claim 1, wherein said detection means is moved together with said objective lens, as one body.

6. An apparatus according to claim 1, wherein an energy filter for said secondary electrons is disposed between said detection means and said objective lens.

7. An apparatus according to claim 3, wherein said lower deflection means is moved together with said objective lens, as one body.

8. An apparatus according to claim 4, wherein one of said electrostatic scanning means and said electromagnetic scanning means each used for forming said lower scanning means is moved together with said objective lens, as one body.

9. An apparatus according to claim 3, wherein an auxiliary objective lens is disposed over said upper deflection means.

10. An apparatus according to claim 4, wherein an auxiliary objective lens is disposed over one of said electrostatic scanning means and said electromagnetic scanning means each used for forming said upper scanning means.

11. An apparatus according to claim 1, wherein a plate having the form of one of a circle and a rectangle and provided with a plurality of lead wires which are radially arranged on said plate and are hermetically bonded thereto by an insulating material, is disposed under said objective lens and is attached to a vacuum vessel, and wherein said plate is mounted with said specimen at a central portion thereof, and an electric signal is supplied from the outside of said vacuum vessel to said specimen.

12. An apparatus according to claim 11, wherein said plate has a completely airtight structure.

13. An apparatus according to claim 11, wherein said plate serves as a prober-card.

14. An apparatus according to claim 13, wherein specimen moving means for moving said specimen in horizontal and vertical directions, is provided under said prober-card.

* * * * *